(12) United States Patent
Braune et al.

(10) Patent No.: US 8,247,263 B2
(45) Date of Patent: Aug. 21, 2012

(54) METHOD FOR PRODUCING AN OPTICAL, RADIATION-EMITTING COMPONENT AND OPTICAL, RADIATION-EMITTING COMPONENT

(75) Inventors: Bert Braune, Wenzenbach (DE); Herbert Brunner, Sinzing (DE); Harald Jäger, Regensburg (DE); Jörg Sorg, Regensburg (DE)

(73) Assignee: Osram Opto Semiconductors GmbH (DE)

( * ) Notice: Subject to any disclaimer, the term of this patent is extended or adjusted under 35 U.S.C. 154(b) by 1096 days.

(21) Appl. No.: 11/885,374

(22) PCT Filed: Feb. 28, 2006

(86) PCT No.: PCT/DE2006/000361
§ 371 (c)(1),
(2), (4) Date: Apr. 14, 2008

(87) PCT Pub. No.: WO2006/089540
PCT Pub. Date: Aug. 31, 2006

(65) Prior Publication Data
US 2008/0197376 A1      Aug. 21, 2008

(30) Foreign Application Priority Data
Feb. 28, 2005   (DE) .................... 10 2005 009 066

(51) Int. Cl.
*H01L 51/40*   (2006.01)
(52) U.S. Cl. .................. 438/99; 257/E33.059; 264/1.1; 264/1.7; 264/2.7

(58) Field of Classification Search .................... 257/99, 257/E33.005, E33.059, E33.071; 438/40; 264/1.1, 1.7, 2.7
See application file for complete search history.

(56) References Cited

U.S. PATENT DOCUMENTS

| | | | |
|---|---|---|---|
| 3,957,713 A | 5/1976 | Jeram et al. | 260/32.8 |
| 4,198,131 A | 4/1980 | Birdsall et al. | 351/160 |
| 6,066,861 A | 5/2000 | Hohn et al. | 257/99 |
| 6,713,571 B2 | 3/2004 | Shimada | 525/526 |
| 6,788,874 B1 | 9/2004 | Ishikawa et al. | 385/141 |
| 7,098,588 B2 | 8/2006 | Jager et al. | 313/498 |
| 2003/0080341 A1 | 5/2003 | Sakano et al. | |
| 2004/0059046 A1* | 3/2004 | Hanna et al. | 524/515 |
| 2004/0122186 A1 | 6/2004 | Herr et al. | |
| 2005/0264194 A1 | 12/2005 | Ng et al. | |
| 2009/0011527 A1* | 1/2009 | Brunner et al. | 438/26 |

FOREIGN PATENT DOCUMENTS
DE        60102282        7/2004
(Continued)

OTHER PUBLICATIONS

Schnitzer et al.; 30% external quantum efficiency from surface textured, thin-film light-emitting diodes; Oct. 18, 1993; American Institute of Physics; p. 2174 (3 pgs).

*Primary Examiner* — Matthew Landau
*Assistant Examiner* — Colleen E Snow
(74) *Attorney, Agent, or Firm* — John B. Hardaway, III; Nexsen Pruet, LLC

(57) ABSTRACT

The invention relates to a method for producing an optical and a radiation-emitting component by a molding process, and to an optical and a radiation-emitting component having well-defined viscosity.

55 Claims, 6 Drawing Sheets

FOREIGN PATENT DOCUMENTS

| | | |
|---|---|---|
| EP | 0 303 744 | 2/1989 |
| EP | 1 220 332 | 7/1989 |
| EP | 0 622 421 | 11/1994 |
| EP | 1 369 458 | 12/2003 |
| EP | 1 408 087 | 4/2004 |
| EP | 1 424 363 | 6/2004 |
| EP | 1 505 121 | 2/2005 |
| GB | 1 423 013 | 2/1973 |
| JP | 63232378 | 9/1988 |
| JP | 07025987 A | 1/1995 |
| JP | 09036282 | 7/1997 |
| JP | 11254477 A | 9/1999 |
| JP | 2000235102 | 8/2000 |
| JP | 2003155342 | 5/2003 |
| JP | 2004277697 A | 10/2004 |
| WO | 98/12757 | 3/1998 |
| WO | 01/51540 | 7/2001 |

\* cited by examiner

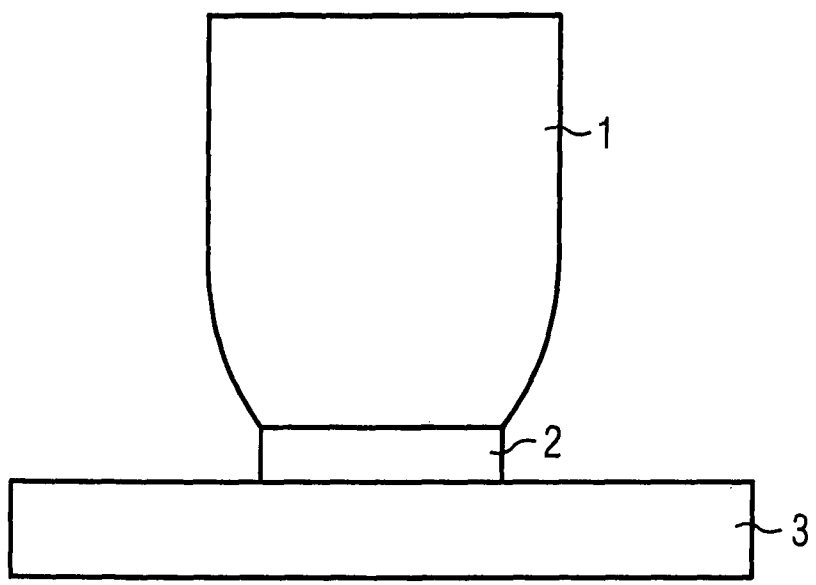
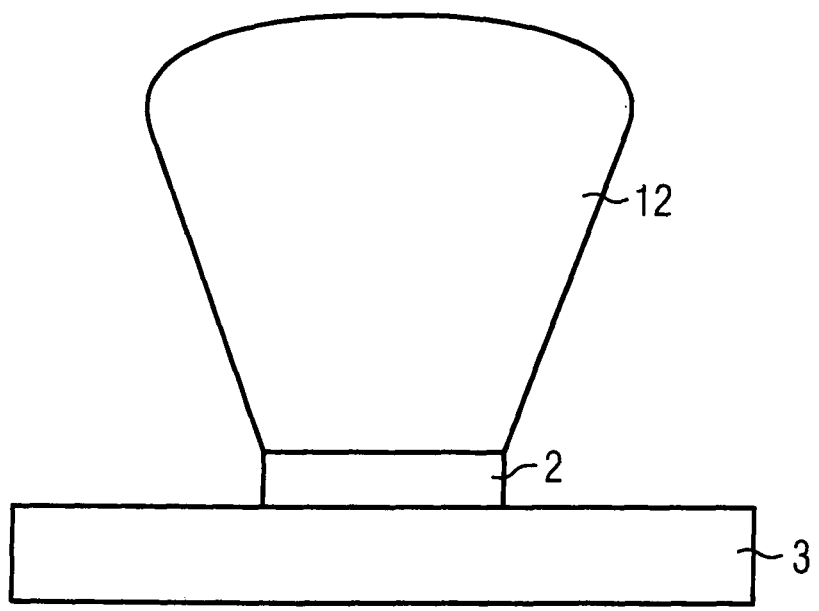

METHOD FOR PRODUCING AN OPTICAL, RADIATION-EMITTING COMPONENT AND OPTICAL, RADIATION-EMITTING COMPONENT

FIELD OF THE INVENTION

The invention relates to a method for producing an optical and a radiation-emitting component by a molding process and to an optical and a radiation-emitting component.

BACKGROUND OF THE INVENTION

A light-emitting diode disclosed in GB 1 423 013 has its semiconductor chip embedded in transparent resins by the use of a transfer molding process. Among other things, the possibility of potting the chip with silicone resin is mentioned there.

The production of optical elements from silicone resins for contact lenses is disclosed in U.S. Pat. No. 4,198,131. Enhanced wearer comfort due to the use of silicone resins is emphasized there.

The use of various silicone resins having a viscosity less than one pascal-second in conjunction with light-emitting diodes is disclosed in EP 1 424 363 A1.

WO 01/50540 A1 discloses a surface-mountable light-emitting diode source wherein a radiation-emitting semiconductor chip on a leadframe is overmolded with an artificial resin by a transfer molding process. The artificial resin compound forms the package of the light-emitting diode light source.

Optical components frequently display material degradation when they are located in the beam path of radiation-emitting electronic components, for example light-emitting diodes (LEDs) that emit in the ultraviolet or blue spectral region. Such material degradation, caused by the effect of high-energy ultraviolet or blue radiation, causes such optical components to exhibit a limited lifetime, the lifetime being defined as the time after which the intensity of the radiation transmitted through the optical component has declined to half its initial value. Material degradation can manifest itself for example in discoloration, in particular yellowing or browning, as well as in embrittlement and cracking of the regions of the optical component that are located in the beam path of the radiation-emitting electronic component. Elevated temperature and/or the additional action of humidity can further speed up material degradation. The lifetime of optical components is additionally reduced as a consequence of continuing technical development of LED semiconductor materials in the sense of increased radiant power of LED semiconductor materials.

Transparent thermoplastics, resins or glass have heretofore been employed in the production of radiation-emitting components and optical components, respectively.

Thermoplastics are distinguished by economy and simplicity of processing. They exhibit low radiation stability for short-wavelength radiation, however, and have a limited service temperature.

Thermosets, in contrast, are distinguished by relatively high temperature stability and good molding qualities as well as dimensional accuracy. Thermosets, however, likewise have low radiation stability for short-wavelength radiation. Their processing is costly, and material costs are comparatively high.

Glass is distinguished by good aging stability and good temperature stability, but the material costs and processing costs are high.

The use of silicone resins has been possible heretofore only to a limited degree. While silicone resins are stable against radiation and aging, the shaping processes (injection molding and molding) for silicone resins are comparatively time- and cost-intensive. Components produced by previously known methods exhibit too little dimensional stability for practical use.

SUMMARY OF THE INVENTION

It is an object of the invention to identify an optical component as well as a radiation-emitting component and methods for their production wherein an improvement is gained through the use of silicone resin and a molding process.

It is further an object of the invention to identify an optical component as well as a radiation-emitting component and methods for their production, an epoxy resin being employed in a molding process.

It is further an object of the invention to identify an optical component as well as a radiation-emitting component and methods for their production, a hybrid material made of silicone resins with an admixture of suitable further resins being employed.

The invention further relates to optical components and radiation-emitting components produced by a method according to the invention.

The invention achieves this object through the independent Claims. Advantageous embodiments and developments of the method and of the component are identified in the dependent Claims.

A method according to the invention for producing an optical and a radiation-emitting component by the use of an injection molding process exhibits in particular the feature that a silicone resin having a viscosity in a range of from 4.5 to 20 pascal-seconds (Pa s), measured at room temperature, is employed as molding compound. A viscosity of 10 Pa s at room temperature proves advantageous here.

The use of an injection molding process proves particularly advantageous when a silicone resin that is liquid at room temperature is employed as molding compound.

Clear silicone resins are preferably used, for example silicones commercially available from Dow-Corning, in order to ensure suitable transparency of the optical and the radiation-emitting component for radiation.

In particular, the silicone resin employed is so adapted to the shaping process that efficient, economical production methods for aging-stable components are made possible by short machine cycle times.

It is advantageous here if the formation of so-called flash is diminished by higher viscosities. An individual skilled in the art understands the term flash to mean an undesired effect in which the molding compound wets regions, for example through creep processes, that are advantageously supposed to remain free of molding compound.

In an embodiment of the method, process temperatures between 100 and 220 degrees Celsius, preferably between 130 and 180 degrees Celsius, are used for the injection molding process. In a preferred embodiment, the process temperature is 150 degrees Celsius.

In a further embodiment of the method, injection pressures of up to 1000 bar, in particular between 50 and 100 bar, are exerted.

It is further advantageous for the method if the molding compound contains admixtures for mold release or separation. Particularly advantageous for this purpose are wax-based materials or metal soaps with long-chain carboxylic acids. Such admixtures for mold release or separation can be employed not just in conjunction with silicone resins but also in conjunction with other molding compounds, also in particular curing molding compounds that exhibit for example epoxides or hybrid materials.

In a further embodiment of the method, the molding compound employed exhibits a conversion substance. The conversion substance dispersed in the molding compound can be an inorganic phosphor pigment powder that contains phosphors having the general formula $A_3B_5X_{12}$:M. In particular, particles from the group of cerium-doped garnets can be used as phosphor pigments, here in particular cerium-doped yttrium aluminum garnet ($Y_3Al_5O_{12}$:Ce, YAG:Ce), cerium-doped terbium aluminum garnet (TAG:Ce), cerium-doped terbium yttrium aluminum garnet (TbYAG:Ce), cerium-doped gadolinium yttrium aluminum garnet (GdYAG:Ce) and cerium-doped gadolinium terbium yttrium aluminum garnet (GdTbYAG:Ce). Further possible phosphors are sulfide- and oxysulfide-based host lattices, aluminates and borates having metal centers correspondingly excitable in the short-wavelength range. Organometal phosphor systems are also usable. Here the phosphor pigments can also contain a plurality of distinct phosphors and the conversion substance can contain a plurality of distinct phosphor pigments. Further, the conversion substance can contain soluble and difficultly soluble organic dyes and phosphor mixtures.

It can be advantageous if a primer, preferably in liquid form, is admixed with the preferably predried conversion substance in order to improve the adhesion of the conversion substance to the molding compound. It is advantageous in particular if, in the case where inorganic phosphor pigments are used, the primer contains 3-glycidoxypropyltrimethoxysilane and/or further trialkoxysilane-based derivatives. The use of a primer here is not limited to use in conjunction with silicone resins. In particular, such primers can also be employed in order to improve the adhesion of a conversion substance to curable molding compounds that exhibit, for example, epoxides or hybrid materials.

It can further be advantageous to use monofunctional and/or polyfunctional polar agents having carboxylic acid groups, carboxylic acid ester groups, ether groups and/or alcohol groups for modifying the phosphor surfaces. It can be particularly advantageous to use diethylene glycol monomethyl ether here. Such a modification can increase the wettability of the highly energetic phosphor surfaces and thus improve the compatibility and dispersion upon processing with the molding compound.

A further advantageous embodiment of the method according to the invention comes about if fillers are admixed with the molding compound in order to raise the refractive index. Fillers can contain in particular glass particles, $TiO_2$, $ZrO_2$, $\alpha$-$Al_2O_3$ or other metal oxides. Further, fillers having non-oxide materials of high refractive index can be admixed, as for example gallium nitride.

In a further embodiment of the method, the cycle times of the molding process lie between 30 seconds and two minutes. Here the cycle time includes the injection time and the curing time of the molding compound in the mold. In particular, the injection times can lie in a range of up to 25 seconds, preferably less than 25 seconds, so that so-called wire sweep, such as occurs when the transfer speed is too great or the viscosity is high, is avoided.

An individual skilled in the art understands the term wire sweep to mean, in a shaping process, for example an injection molding process, a transfer molding process or a molding process, an undesired effect of a molding compound particularly on the electrical contacting of electronic components, for example on bond wires via which, for example, radiation-emitting electronic components are contacted. A high transfer speed of the molding compound, caused for example by a high injection pressure or a high molding speed, and a high viscosity of the molding compound can cause a disadvantageous deformation of a bond wire up to decontacting of the electronic component due to interruption of electrical conduction via the bond wire.

In an embodiment of an optical component, the optical component is produced by one of the previously identified methods.

A further method according to the invention for producing a radiation-emitting component is characterized in that epoxy resins having a viscosity of from 4 to 35 Pa s measured at 150 degrees Celsius or silicone resins having an admixture of between 30 and 80% epoxy resins (hybrid material) and a viscosity between 0.9 and 12 Pa s measured at room temperature are employed in a transfer molding process.

It can be advantageous here if solid materials, in particular materials in tablet shape, are employed in the transfer molding process.

In an embodiment of the method, prefabricated components such as electronic components are provided or overmolded with a molding compound at least in partial regions by the transfer molding process.

In an embodiment of the method, a clear epoxy-based molding compound is employed; preferably employed is an epoxy resin having the composition 10-20% tris(2,3-epoxypropyl)-1,3,5-triglycidyl isocyanurate, 20-35% tetrahydrophthalic anhydride, 45-60% bisphenol A epoxy resin and 2-3% quartz glass, which is available for example under the brand name Nitto NT 300H-10025.

In a preferred embodiment, the epoxy resin exhibits a viscosity of 10 Pa s measured at 150 degrees Celsius. As a consequence, the molding compound has good processing qualities and, at the same time, an electronic component to be overmolded experiences less impairment, in particular because wire sweep can occur particularly starting at a viscosity of 50 Pa s measured at 150 degrees Celsius.

In a preferred embodiment, the hybrid material exhibits a silicone resin having a 50 percent admixture of epoxy resins.

In an embodiment of the method, the process temperature in transfer molding lies between 100 and 220 degrees Celsius, preferably between 130 and 180 degrees Celsius. It can be particularly advantageous here if the process temperature is 150 degrees Celsius.

In a further embodiment of the method, injection pressures between 50 and 100 bar are exerted in the transfer molding process.

In a further embodiment of the method for producing radiation-emitting semiconductor components, the molding compound used contains an admixture for mold release or separation, in particular wax-based materials or metal soaps with long-chain carboxylic acids.

In a further embodiment of the method for producing radiation-emitting semiconductor components, the molding compound used exhibits a conversion substance. The conversion substance dispersed in the molding compound can be an inorganic phosphor pigment powder that contains phosphors having the general formula $A_3B_5X_{12}$:M. In particular, particles from the group of cerium-doped garnets can be used as phosphor pigments, here in particular cerium-doped yttrium aluminum garnet ($Y_3Al_5O_{12}$:Ce, YAG:Ce), cerium-doped terbium aluminum garnet (TAG:Ce), cerium-doped terbium yttrium aluminum garnet (TbYAG:Ce), cerium-doped gadolinium yttrium aluminum garnet (GdYAG:Ce) and cerium-doped gadolinium terbium yttrium aluminum garnet (GdTbYAG:Ce). Further possible phosphors are sulfide- and oxysulfide-based host lattices, aluminates and borates having metal centers correspondingly excitable in the short-wavelength range. Organometal phosphor systems are also usable. Here the phosphor pigments can also contain a plurality of distinct phosphors and the conversion substance can contain a plurality of distinct phosphor pigments. Further, the conversion substance can contain soluble and difficulty soluble organic dyes and phosphor mixtures.

It can be advantageous if a primer, preferably in liquid form, is admixed with the preferably predried conversion substance in order to improve the adhesion of the conversion substance to the plastic molding compound. It is advantageous in particular if in the case where inorganic phosphor pigments are used, 3-glycidoxypropyltrimethoxysilane or further trialkoxysilane-based derivatives are employed as primer.

It can further be advantageous to use monofunctional and/or polyfunctional polar agents having carboxylic acid groups, carboxylic acid ester groups, ether groups and/or alcohol groups for modifying the phosphor surfaces. It can be particularly advantageous to use diethylene glycol monomethyl ether here. The use of such additives can increase the wettability of the highly energetic phosphor surfaces and thus improve the compatibility and dispersion upon processing with the molding compound.

A further advantageous embodiment of the method according to the invention comes about if fillers are admixed with the molding compound in order to raise the refractive index. Fillers can contain in particular glass particles, $TiO_2$, $ZrO_2$, $\alpha\text{-}Al_2O_3$ or other metal oxides. Further, fillers having non-oxide materials of high refractive index can be admixed, as for example gallium nitride.

In a further embodiment of the method, the transfer molding process exhibits cycle times between two and eight minutes; in particular, it can be advantageous if the method exhibits a cycle time of five minutes; further, it can be particularly advantageous if the method exhibits a cycle time of up to three minutes, in particular less than three minutes, because longer cycle times generally render the method less economical. Here the cycle time includes the injection time and the curing time of the molding compound in the mold. In particular, the injection times can lie in a range of up to 25 seconds, preferably less than 25 seconds.

It can be advantageous if curing times between three and five minutes are used in the transfer molding process, because the adaptation of the molding compound to the automatic process with short holding and curing times in the shaping mold makes possible an economical method.

Short curing times and short process times are advantageous for the production method so that the quantity yielded, that is, the quantity produced, is not too small, so that the component production costs remain in the economical realm.

In an embodiment of a radiation-emitting component, a radiation-emitting semiconductor component is produced by one of the methods according to the invention.

In an embodiment of a radiation-emitting component, a radiation-emitting component is produced that exhibits an optical component produced by one of the methods according to the invention.

In an embodiment of a radiation-emitting component, an optical component produced by a method according to the invention is disposed in front of an optoelectronic semiconductor component.

Here and in what follows, "disposed in front" means that the optical component is located in the beam path of the radiation-emitting semiconductor component.

In an embodiment of a radiation-emitting semiconductor component, a premolded package exhibits an overmolding of a semiconductor chip by one of the methods according to the invention.

In a further embodiment of a radiation-emitting semiconductor component, a premolded package exhibits an overmolding of a semiconductor chip inside the premolded package by a method according to the invention as well as an optical component disposed in front of the semiconductor chip.

In an embodiment of a radiation-emitting semiconductor component, a semiconductor chip on a base package is overmolded with a silicone resin mixture by a method according to the invention.

In a further embodiment of a radiation-emitting semiconductor component, an optical component is disposed in front of an overmolded semiconductor chip in the radiation direction, the optical component being one that was produced by a method according to the invention.

In a further embodiment of a radiation-emitting semiconductor component, the silicone mixture of the overmolding of the semiconductor component exhibits less dimensional stability than the silicone mixture of the optical component disposed in front. This embodiment is advantageous in particular for power configurations.

In a further embodiment, the invention comprises a method for producing an optical component, the optical component being produced from a material that comprises a hybrid material, the hybrid material
  exhibiting, as first component, at least one compound containing siloxane groups and
  exhibiting, as second component, compounds whose functional groups are selected from epoxide groups, imide groups and acrylate groups.

The use of a hybrid material for producing an optical component makes it possible for the optical component to combine advantageous properties of compounds containing siloxane groups, for example silicones, with properties advantageous for the optical component associated with compounds having epoxide groups, imide groups and acrylate groups, in particular thermoset plastics, for example epoxy resins, polyimide resins and acrylate resins. Advantageous properties of compounds containing siloxane groups are for example temperature stability and aging stability. Advantageous properties of compounds having epoxide groups, imide groups and acrylate groups, such as are exhibited by optically transparent polymers, are for example short curing times and good adhesion of the material to surfaces that exhibit for example copper, silver or silicon. Further, hybrid materials can exhibit advantageous properties such as for example high hardness and high elasticity and also, in particular, less brittleness and fragility than silicones, which exhibit high hardness in the cured state. In particular, hybrid materials can exhibit good optical properties, in particular high transparency for electromagnetic radiation in at least one wavelength range, and thus can advantageously be used for producing an optical component.

In a further embodiment of the method, the optical component is molded from the hybrid material.

In a further embodiment of the method, the first component and the second component of the hybrid material exhibit monomers. When the monomers are crosslinked in the course of a polymerization process, the monomers of the first component and the second component form a copolymer.

In a further embodiment of the method, the first component and the second component of the hybrid material exhibit polymers. In particular, the first component exhibits polysiloxanes and the second component polymers selected from epoxy resins, polyimides and polyacrylates. When the polymers are crosslinked together in the course of a curing process, the polymers form a polymer mixture in which the individual polymers are crosslinked with one another.

In a further embodiment of the method, the second component of the hybrid material additionally exhibits siloxane groups.

In further embodiments, the hybrid material exhibits a siloxane content in a range of from 10 to 90% by weight. The hybrid material preferably exhibits a siloxane content in a range of from 40 to 60% by weight, in particular 40% by weight or 50% by weight.

In a further embodiment, the hybrid material before curing, that is, in the un-crosslinked state, exhibits a viscosity of 0.5 to 200 Pa s measured at room temperature.

In a preferred embodiment of the method, the hybrid material is precured to a preproduct that is solid at room temperature. Here the un-crosslinked hybrid material is subjected to suitable conditions, for example a temperature, a pressure, electromagnetic radiation, for example radiation in the ultraviolet or infrared range of wavelengths, or a combination thereof, so that a crosslinking reaction between the first component and the second component of the hybrid material begins. Through appropriate adjustment of the crosslinking conditions, for example prematurely changing the pressure or changing the temperature or prematurely cutting off the electromagnetic radiation, the crosslinking reaction can be brought to a halt and the hybrid material, which now exhibits partial crosslinking of the first component and the second component, forms a preproduct that is solid at room temperature. The preproduct so obtained can be in any solid shape, for example in the shape of a slab or block. It can further be advantageous if the preproduct so obtained is subjected to size reduction, for example by grinding or pounding, and thus converted for example to a granulate form or a powder form. The powder form of the preproduct is particularly suitable for the addition of further materials in powder form, for example fillers or wavelength conversion substances, to the preproduct. Further, it can be advantageous to shape the preproduct after size reduction, for example by agglomeration, compaction or sintering, advantageously by molding. A preproduct present in powder form is advantageously molded to a shape, for example to a tablet or pellet shape. This operation makes possible accurate metering of the preproduct by weight and accurate geometrical adaptation, for example with respect to the dimensions of the shape. In this way, the preproduct can be furnished in suitable quantities and sizes for further processing.

Further, the hybrid material can be put into a discrete shape, for example a pellet or tablet shape, by a shaping process, for example by casting and subsequent partial curing.

Further, the first component and the second component of the preproduct can be further crosslinked after precuring to the preproduct and shaping; that is, the preproduct is further cured. The conditions here can be the same as or different from those under which the preproduct was made.

In a further embodiment of the method, the optical component is formed as a molding from the hybrid material or the preproduct. The molding is advantageously formed in a cavity of a mold, the optical component being made with a shape corresponding to the shape of the cavity. In particular, a molding process, a transfer molding process or an injection molding process can be used here. The molding can now exhibit any shape suitable for the optical component.

In a particularly preferred embodiment, the molding made of the preproduct is formed in a transfer molding process.

Here the preproduct in solid form, for example as a powder molded into tablets, is fed to the transfer molding machine. It can be advantageous here if the transfer molding process is carried out at a temperature between 100 and 220 degrees Celsius, preferably in a range of from 130 to 180 degrees Celsius, the preproduct preferably being reliquefied. The preproduct so liquefied is now injected into the mold cavity by a sprue system, it being possible for a pressure of from 50 to 100 bar to prevail.

In a further embodiment, the preproduct exhibits a viscosity in a range of from 1 mPa s to 30 Pa s at a temperature of 150 degrees Celsius. The preproduct preferably exhibits a viscosity at 150 degrees Celsius that is comparable to or higher than that of epoxy-based molding compounds, viscosities of more than 4 Pa s being preferred in particular, more than 10 Pa s being particularly preferred. In this way the preproduct can be processed in conventional transfer molding machines, slight or no adaptations of the transfer molds being necessary, in particular with respect to venting of the cavity or the sprue system, with respect to injection points and with respect to drafts for removal from the mold. Moreover, a higher viscosity reduces the tendency to formation of so-called flash. In the case where an optical component is molded onto or around a substrate, in particular a substrate on which an optoelectronic component is disposed, the sensitivity of the method to thickness tolerances and irregularities of the substrate can be reduced by a higher viscosity.

In a further embodiment, the hybrid material or the preproduct is processed by curing to a cured hybrid material. The curing of the hybrid material takes place through a reaction in which the first component and the second component are crosslinked under suitable conditions, for example a temperature, a pressure, an electromagnetic radiation or a combination thereof. The curing of the preproduct takes place through a continuation of the crosslinking reaction under suitable conditions, for example a temperature, a pressure, an electromagnetic radiation or a combination thereof. The conditions under which the preproduct is cured can be the same as or different from those under which the preproduct was made from the hybrid material.

In a preferred embodiment, the curing of the hybrid material or the preproduct to a cured hybrid material in the form of a molding takes place at least partly in the cavity of a mold. Complete curing of the hybrid material or the preproduct to a finally cured hybrid material can likewise take place in the mold cavity or alternatively outside the mold cavity. The conditions during final curing can be held constant or varied. Preferably, complete curing means the greatest possible extent of crosslinking of the first component and the second component.

In a preferred embodiment, the hybrid material or the preproduct exhibits a curing time of less than 5 minutes. Short curing times can be advantageous for short machine cycle times, which can have a positive impact on the economics of the method.

In a further preferred embodiment, the cured hybrid material exhibits a hardness in a range of from 80 Shore A to 80 Shore D, preferably higher than 60 Shore D. Compounds having epoxide, imide and acrylate groups can attain high hardness in the cured state, which can be advantageous for the stability and subsequent processability of a component. In contrast to pure silicone resins, a hybrid material can thus exhibit greater hardness and less brittleness. High hardness combined with high stiffness of the molding can be advantageous, for example in relation to easier separation of the sprue system of the mold after the injection of the hybrid material or the preproduct into the mold cavity. In this way, reduced contamination of the mold can advantageously be made possible by well-defined fracturing of the sprue system. In particular, this has the consequence of reduced cleaning effort, which can have a positive impact on the economics of the method. Further, given a high hardness of the cured hybrid material, the optical component can exhibit high resistance to mechanical effects. High hardness is particularly advantageous when the optical component is subjected to further mechanical treatment, for example by sawing. Too little hardness means that the optical component can deform as a result of stresses arising during mechanical treatment and can deform again after mechanical treatment because of the stress, which can lead to a disadvantageous and undesired shape deviation in the optical component.

In a particularly preferred embodiment, the method for producing an optical component, wherein the optical component is produced from a material that comprises a hybrid material, comprises the following procedural steps:

A) Converting a preproduct, obtained from the hybrid material by precuring, into a liquid or pasty state, B) Placing the preproduct from procedural step A) in a cavity of a mold, the cavity exhibiting a definite shape, and C) Curing the preproduct to a solid hybrid material, the optical component being made with a shape largely corresponding to the shape of the cavity.

The preproduct obtained from the hybrid material by precuring can be converted to a liquid or pasty state by the action of heat and/or the application of pressure. In particular, the preproduct can be converted to a liquid or pasty state in a sprue system of a transfer mold or injection mold. The preproduct in the liquid or solid state can be inlet into the mold cavity via the sprue system. The preproduct here can fill the space in the cavity at least in part and thus take on a corresponding shape. Final curing of the preproduct to a cured hybrid material makes it possible to obtain the shape largely corresponding to the shape of the cavity for the cured hybrid material.

In a further embodiment, the method for producing an optical component comprises the additional procedural steps to be executed before procedural step A):

A1) Precuring the hybrid material to a preproduct that is solid at room temperature, A2) Subjecting the solid preproduct to size reduction to a powder or granulate state, and A3) Converting the preproduct after size reduction to a compact shape.

The preproduct after size reduction, for example in powder or granulate form, can be converted by agglomeration or compaction, advantageously by molding. The compact shape here can be a tablet or pellet shape.

In a further embodiment of the method, a foil is applied to at least part of the inner cavity wall before the hybrid material or the preproduct is admitted to the mold cavity (foil molding). The foil is applied in such fashion that in the subsequent molding process it is located between the hybrid material or the preproduct and the inner cavity wall, so that wetting of the inner cavity wall and associated adhesion of the hybrid material or the preproduct to the inner cavity wall can be avoided. The use of a heat-resistant foil that expands under the action of temperature is particularly advantageous here. The use of a foil can be advantageous in particular when a hybrid material or a preproduct of low viscosity is employed. In this way the necessity of a mold cleaning operation subsequent to the molding process can be avoided. It is advantageous here if the foil does not affect the shaping of the cavity, for example if the foil is very thin. It is particularly advantageous if the foil is no thicker than 40 micrometers.

Furthermore, it is particularly advantageous if the foil is in contact with the whole inner cavity wall and thus has the same shape as the inner cavity wall. This can be done for example by using suction to pull the foil against the inner cavity wall by a suitable structure of the inner cavity wall. A suitable structure of the inner wall can be for example a multiplicity of holes and/or regions having a porous material, against which and by which the foil can be pulled via a vacuum system, which sets up a negative pressure at least in the vicinity of the inner wall. Here it can be advantageous if the foil expands under the additional action of temperature. In this way it is possible to control the contact of the foil with the inner cavity wall in a favorable fashion.

It is further advantageous if the hybrid material or the preproduct adheres only slightly or not at all to the foil, so that the foil can be removed easily after the molding process with little effect on the surface of the hybrid material, which is at least partly cured.

Further, the use of the foil can provide improved sealing of the cavity and/or the region to be molded. When a hybrid material or a preproduct having a low viscosity is employed, the use of a foil can therefore be advantageous because the wetting of regions, for example of the mold, that are supposed to remain free of the hybrid material or the preproduct can be greatly reduced and thus less flash is formed. A subsequent cleaning process can advantageously be avoided in this way.

In a further embodiment of the method, a mold release agent is additionally admixed with the hybrid material or the preproduct. It is advantageous here if the mold release agent does not significantly affect the optical properties of the optical component to be produced, and additionally is stable against aging. The use of a mold release agent can prove particularly advantageous in the production of the optical component because the use of the mold release agent facilitates the separation of the at least partly cured hybrid material from the mold. This can be advantageous particularly when—because of special properties of the optical component to be fabricated, in particular when the optical component to be fabricated contains very small structures—there are no other options for facilitated mold release, for example by the application of a foil to the inner wall of the mold cavity.

In an embodiment of the method, a wavelength conversion substance is admixed with the hybrid material or the preproduct. Wavelength conversion substances are suitable for absorbing at least a portion of a radiation that passes through the optical component in a first wavelength range and emitting electromagnetic radiation having a second wavelength range distinct from the first wavelength range. In this connection, a wavelength conversion substance can exhibit in particular inorganic phosphor powders that exhibit nitrides and/or silicates, as well as for example cerium-doped yttrium aluminum garnet powder and cerium-doped terbium aluminum garnet powder as well as combinations thereof. Suitable organic and inorganic phosphors are listed for example in the publications WO 01/50540 A1 and WO 98/12757 A1, whose disclosure content regarding phosphors is hereby incorporated by reference.

In an embodiment of the method, the wavelength conversion substance is admixed with the hybrid material. Next the hybrid material is precured to a preproduct, so that a mixture of the preproduct and the wavelength conversion substance is obtained in the shape for example of slabs. The mixture of preproduct and wavelength conversion substance so obtained can be subjected to size reduction, preferably ground to a powder, and the resulting powder mixture can be put into a compact shape, here preferably molded into tablets.

In a further embodiment of the method, the wavelength conversion substance is admixed with the preproduct, which is in the form for example of a cohesive solid, in particular as a slab or as a block. Alternatively, the preproduct can be in granulate form. The preproduct is subjected to size reduction together with the admixed wavelength conversion substance, yielding a powder, and the powder mixture so obtained is shaped, preferably molded into tablets. A homogeneous mixture of preproduct and wavelength conversion substance can advantageously be achieved in this way.

In a further embodiment of the method, the wavelength conversion substance, preferably in powder form, is admixed with a preproduct in powder form, and the powder mixture so obtained is shaped, preferably molded into tablets.

The color coordinates and saturation of the radiation exiting the optical component can be accurately adjusted because accurate blending of the wavelength conversion substance is possible. A homogeneous color impression of the exiting radiation can be made possible by employing short curing times with the hybrid material in order to avoid sedimentation of the wavelength conversion substance.

In a preferred embodiment of the method, the wavelength conversion substance is so selected that at least a portion of the radiation entering the optical component is converted to another wavelength. The radiation entering the optical component can exhibit a wavelength in the range from ultraviolet to green radiation, and the converted radiation a wavelength in the range from green to red radiation. If only a portion of the radiation entering the optical component is converted to another wavelength and/or if at least a portion of the radiation entering the optical component is converted to at least two wavelengths, an exit spectrum comprising a mixture of colors can be generated for the exit radiation. The selection of the wavelength conversion substance is dependent on the wavelength spectrum of the radiation entering the optical component and on the desired exit spectrum.

In a preferred embodiment of the method, the wavelength conversion substance is so selected that the radiation entering the optical component exhibits a wavelength in the range of blue radiation and the radiation exiting the optical component exhibits a mixture of a plurality of wavelength ranges, so that the impression of white light comes about.

In a further embodiment of the method of the method, a material is admixed with the hybrid material or the preproduct in order to raise the refractive index. Raising the refractive index can be advantageous, for example, in the production of lenses or other light-refracting optical components. Here the material for raising the refractive index can be chemically bonded to the hybrid material; in particular it can be chemically bonded titanium, zirconium and/or sulfur. Moreover, the material for raising the refractive index can be admixed with the hybrid material or the preproduct in the form of an oxide; in this case it can be in particular a metal oxide, for example $TiO_2$, $ZrO_2$, $\alpha$-$Al_2O_3$. Particles, in particular glass particles, can further be admixed with the hybrid material or the preproduct as the material for raising the refractive index. Further, materials having non-oxide materials of high refractive index can be admixed, say for example gallium nitride.

In a further embodiment of the invention, an optoelectronic component is encapsulated by an optical component surrounding the cured hybrid material or preproduct, the optical component and the optoelectronic component being so disposed relative to each other that the optical component encloses the optoelectronic component. Here the optoelectronic component can be disposed on a substrate or not.

In a preferred embodiment of the method, the optical component is so fashioned that it is at least partly molded onto the optoelectronic component in such a manner that the optoelectronic component is in contact with the optical component. In particularly preferred fashion, the optical component forms an at least partly positively fitting shell for the optoelectronic component.

In a further embodiment of the method, an optoelectronic component is encapsulated by an optical component, the optoelectronic component being disposed on a substrate and the optical component being so disposed over the optoelectronic component that the optoelectronic component is enclosed by the substrate and the optical component. Thus the optical component can also be part of an encapsulation of an optoelectronic component.

In a further embodiment of the method, an optoelectronic component on a substrate is at least partly enclosed by the hybrid material or the preproduct during the curing thereof. Here the hybrid material or the preproduct can be at least partly or completely cured.

In a further embodiment of the method, the optoelectronic component on a substrate is so placed in the mold cavity that the hybrid material or the preproduct is at least partly molded onto the optoelectronic component upon injection into the cavity. Here the hybrid material or the preproduct can completely or at least partly enclose the optoelectronic component and the substrate. A suitable geometry of the substrate can prove advantageous if the cured hybrid material exhibits a low hardness. In particular, the dimensional stability of the optical component can be advantageously influenced, in particular enhanced, in this way.

In a further embodiment of the method, a radiation-emitting optoelectronic component is employed as optoelectronic component. It is preferably a radiation-emitting semiconductor chip, for example a luminescence diode chip such as, say, a light-emitting diode, a semiconductor chip, a thin-film light-emitting diode chip or an organic electroluminescent light-emitting diode chip (OLED).

A thin-film light-emitting diode chip is distinguished in particular by the following characteristic features:

On a first principal face of a radiation-generating epitaxial film stack, facing toward a support element, a reflective film is applied or fashioned, which reflects at least a portion of the electromagnetic radiation generated in the epitaxial film stack back thereinto;

The epitaxial film stack exhibits a thickness in the range of 20 μm or less, in particular in the range of 10 μm; and The epitaxial film stack contains at least one semiconductor layer having at least one face that exhibits a completely mixed structure, which in the ideal case leads to an approximately ergodic distribution of the light in the epitactic epitaxial film stack, that is, it exhibits as nearly as possible an ergodic stochastic scattering behavior.

A fundamental principle of a thin-film light-emitting diode chip is described for example in I. Schnitzer et al., Appl. Phys. Lett. 63 (16), Oct. 18, 1993, 2174-2176, whose pertinent disclosure content is hereby incorporated by reference.

OLEDs in principle comprise electroluminescent organic films disposed between two electrodes. When an electric potential is imposed on the electrodes, recombinations between electrons and "holes" injected into the organic films cause the emission of light.

In a further embodiment of the method, a radiation-receiving optoelectronic component, for example a photodiode, a phototransistor or a photo-IC, is employed as an optoelectronic component.

In a further embodiment of the method, a radiation-emitting semiconductor chip capable, when in operation, of emitting radiation having a wavelength in a wavelength range from ultraviolet to green is employed as optoelectronic component. A radiation-emitting semiconductor chip capable, when in operation, of emitting radiation in the blue wavelength range is preferably employed.

Further, the optoelectronic component can be disposed on a substrate, the substrate exhibiting a leadframe, a printed circuit board, a flex-material-based configuration or a ceramic-based configuration.

Further, at least portions of the substrate and/or of the optoelectronic component that are in contact with the hybrid material or the preproduct can be coated with a material that is suitable for improving adhesion between the substrate and/or the optoelectronic component and the hybrid material or the preproduct. The material preferably exhibits a silicate, a thin, very dense and tightly adhering silicate film being applied to the substrate by flame pyrolysis of an organosilicon compound. The silicate film exhibits a high surface energy and therefore is particularly suitable for increasing the adhesion of the hybrid material or the preproduct to the substrate. This embodiment of the method is particularly advantageous when the optical component exhibits no mechanical anchoring to the substrate or to the optoelectronic component but adheres only to the substrate and/or to the electronic component.

Further, adhesion between the substrate and/or the optoelectronic component and the hybrid material or the preproduct can be increased by plasma pretreatment of the substrate and/or the optoelectronic component.

Further, the mold cavity can be so fashioned that a multiplicity of optical components are produced in one molding process. The multiplicity of optical components are produced in one piece, that is, in such fashion that the optical components cohere at least in subregions after the molding process. The production of a multiplicity of optical components in one cavity facilitates the production process in such fashion that only one cavity has to be evacuated in the course of the molding process. Such evacuation can be effected via a common opening in the cavity for all or a plurality of regions of the cavity in which an optical component is molded. Likewise, charging, for example the injection of the molding compound into the cavity, can be effected via a common sprue system for all or a plurality of regions in which an optical component is molded. This can be particularly advantageous when the optical components exhibit a very small size, because a single cavity in which only one optical component can be molded must likewise exhibit an opening for evacuation of the cavity and a sprue system.

In a further embodiment of the method, the cavity is so shaped that the multiplicity of optical components are disposed next to one another in a row.

In a further embodiment of the method, the cavity is so shaped that the multiplicity of optical components are disposed in planar fashion, that is, that the optical components are disposed next to one another in a plane.

In a further embodiment of the method, a multiplicity of components that were molded in a common cavity are separated after the molding process. Separation can be effected by cutting, sawing, notching, breaking, grinding, laser cutting or combinations thereof. Here it can be advantageous if the cavity exhibits, between the regions in which the optical components are molded, regions in which there are molded connecting regions between the optical components in which separation can be carried out. Such connecting regions can advantageously be fashioned thinner than the optical components and can exhibit, for example, designated breaking points.

In a further embodiment of the method, a plurality of optoelectronic components are placed in a common cavity. In this way the plurality of optoelectronic components can be overmolded and/or encapsulated by molding of the multiplicity of optical components.

In a further embodiment of the method, each optoelectronic component is mounted on its own substrate and the multiplicity of substrates having optoelectronic components are placed in the mold cavity before the molding process.

In a further embodiment of the method, a plurality of optoelectronic components are mounted on a common substrate and the entire substrate having the plurality of optoelectronic semiconductor components is placed in the mold cavity before the molding process.

Also the subject of an embodiment of the invention is an optical component that can be obtained by a method according to the invention.

In a further embodiment, the optical component is located in the beam path of an electromagnetic radiation. In particular, at least portions of the optical component are located in the beam path of an electromagnetic radiation. The electromagnetic radiation here can be emitted by a radiation-emitting component. In particular, the optical component exhibits at least regions in which the optical component is at least partly transparent to the electromagnetic radiation. The transparency is preferably so designed that a diminution of the intensity of the radiation transmitted through the optical component can be reduced through reflection or absorption process in the optical component or at the boundaries of the optical component.

Further, in an embodiment the optical component exhibits at least one first surface, which is referred to as the entrance face, into which the electromagnetic radiation enters. Further, the optical component exhibits at least one second surface, which is referred to as the exit face, from which the electromagnetic radiation again exits after propagation through at least individual regions of the optical component. Here the entrance face and the exit face of the optical component can be of any shape and in any orientation relative to one another. Moreover, the electromagnetic radiation entering the optical component and the electromagnetic radiation exiting from the optical component can differ in their properties, for example with respect to intensity, direction, wavelength, polarization and coherence length.

In a further embodiment of the optical component, the optical component is in particular a radiation-diffracting optical component, a radiation-refracting optical component, a reflector, a wavelength converter, a package, a portion of a package, an encapsulation, a portion of an encapsulation or a combination thereof.

In a further embodiment of the optical component, the radiation-refracting optical component is a lens, in particular a spherical lens, an aspherical lens, a cylindrical lens or a Fresnel lens.

Also the subject of an embodiment of the invention is a disposition that comprises an optical component that can be obtained by a method according to the invention and an optoelectronic component. In particular, the optical component is so disposed over an optoelectronic component that at least a portion of the optical component is located in the beam path of the optoelectronic component. Here the optical component exhibits such a shape that it at least partly encloses the optoelectronic component. In particular, the optical component can at least partly encapsulate the optoelectronic component as a result. The optoelectronic component can here be disposed on a substrate, it being possible to mold the optical component in such fashion that it encloses at least a portion of the substrate.

In a further embodiment of the disposition, the disposition exhibits such a shape that it is surface-mountable.

In what follows, further advantages, preferred embodiments and developments of the invention will become apparent in conjunction with the exemplary embodiments explained with reference to FIGS. 1 to 8, in which:

BRIEF DESCRIPTION OF DRAWINGS

FIG. 1 is a schematic depiction of a radiation-emitting semiconductor component having an optical component according to the invention;

FIG. 2 is a further schematic depiction of a radiation-emitting semiconductor component having an optical component according to the invention;

DETAILED DESCRIPTION

Figure 3A:
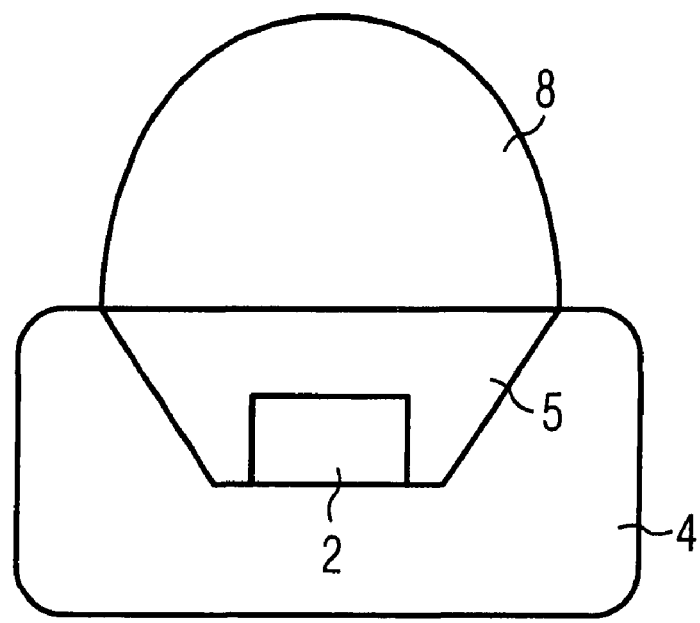
FIGS. 3a and 3b are further schematic depictions of radiation-emitting semiconductor components according to the invention.

In the exemplary embodiments and the Drawings, constituents that are identical or have identical actions are provided with identical reference characters. The elements depicted and their size relationships to one another are not to be regarded as to scale; instead, individual elements can be depicted as exaggeratedly large in size so that they can be better depicted and/or better comprehended.

In an exemplary embodiment according to FIG. 1, an optical component 1 produced by a method according to the invention is disposed on a semiconductor chip 2, which is mounted on a substrate 3. Optical component 1 is a so-called compound parabolic concentrator (CPC).

Embodiments according to the invention also, however, include optical components such as lenses, diffractive optics, reflectors or generally all kinds of optical components.

The production of optical components by a method according to the invention makes it possible to employ silicone resins for the production of all ordinary optical components. The method according to the invention offers the possibility of producing optical components that combine the advantages of the aging stability of silicone resins with a markedly improved dimensional stability.

The exemplary embodiment of a radiation-emitting semiconductor component depicted in FIG. 1 is a so-called chip-on-board (COB) assembly.

Here semiconductor chip 2 can be a conventional light-emitting diode chip or also a thin-film light-emitting diode chip. Optical component 1 can perform a plurality of functions. It can serve for beam forming but also for converting the emission spectrum of the semiconductor chip. To this end, a so-called conversion substance can be admixed into the molding compound of optical component 1. The conversion substance can be a phosphor pigment powder, which for example converts a certain component of short-wavelength light to longer-wavelength radiation, so that the impression of a multicolored light source, in particular a white light source, comes about.

Further optical components can be compound elliptical concentrators (CEC) or compound hyperbolic concentrators (CHC). These components can be provided with reflective lateral walls. The light entrance faces and light exit faces of the concentrators can exhibit arbitrary geometrical shapes, in particular ellipses, circles, squares and polygons of regular and irregular type.

The concentrator is preferably disposed in front of the semiconductor chip and its principal emission direction; that is, it is located in the optical beam path of the semiconductor chip.

Semiconductor chip 2 can additionally be surrounded by a frame on or in which optical component 1 is mounted. The frame can immobilize optical component 1 and/or align it relative to the chip output face.

FIG. 2 depicts a further exemplary embodiment of a radiation-emitting semiconductor component according to the invention. In the semiconductor component, a semiconductor chip 2 is disposed on a substrate 3. An optical component 12 according to the invention is disposed in front of semiconductor chip 2. Optical component 12 here is an optic similar in its action to a CPC. It exhibits a comparable efficiency and is distinguished by simplified production. The desired optical properties are achieved through straight lateral faces in conjunction with a domed exit face. The exemplary embodiment in FIG. 2, like the exemplary embodiment in FIG. 1, relates to a so-called chip-on-board unit.

Figure 3B:
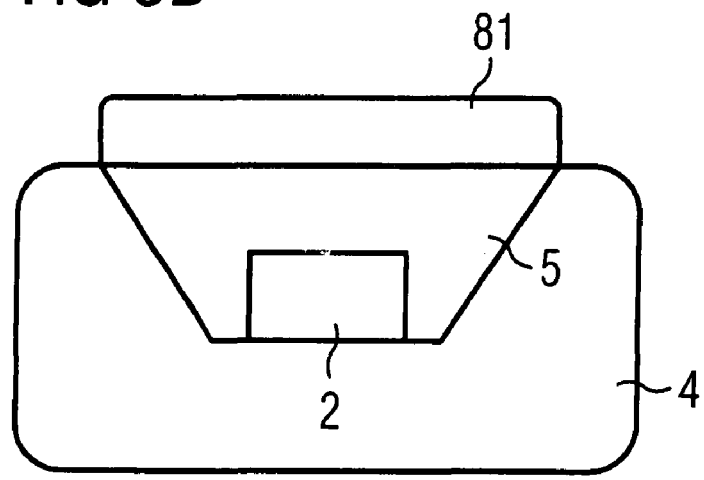

FIG. 3, in both panels a and b, depicts schematically two embodiments of radiation-emitting semiconductor components according to the invention. Both panels a and b have in common that a semiconductor chip 2 is disposed inside a premolded package 4 and surrounded by an overmolded region 5. The overmolding of region 5 can be carried out by a method according to the invention. Optic 8 or 81, respectively, is disposed above overmolded region 5. In a procedural step according to the invention, optic 8 or 81, respectively, can be produced in common with overmolded region 5 or produced separately by a method according to the invention and subsequently disposed on overmolded region 5. Possible examples for optics 8 and 81, respectively, are Fresnel lenses, spherical lenses, aspherical lenses or diffractive optics.

Figure 4A:
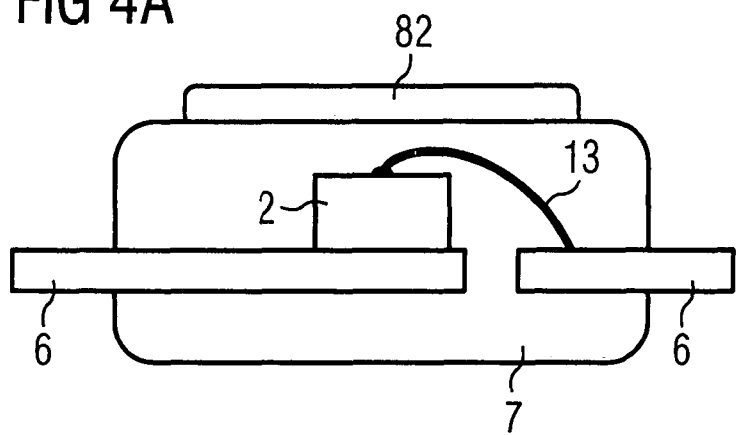
FIGS. 4a and 4b are further schematic depictions of radiation-emitting semiconductor components according to the invention.
Figure 4B:
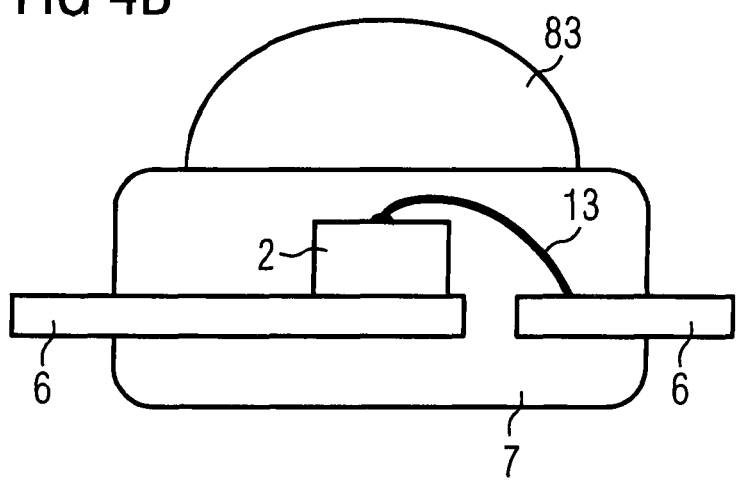

FIG. 4, in panels a and b, depicts two further preferred embodiments of radiation-emitting semiconductor components according to the invention. In production, a semiconductor chip 2 disposed on a leadframe 6 is overmolded with transfer molding compound in a transfer molding process, and a molded package 7 comes about. This technique is already known; for example, Osram markets products using this technique under the tradename SmartLED or Firefly. This production method has heretofore been applicable to silicone-free resins. The method according to the invention makes possible the employment of silicone resins in this field. An optic 82 or 83, respectively, can be disposed on molded package 7. This optic 82 or 83, respectively, can either be produced in a transfer molding process together with molded package 7 or, however, can also be produced separately by a method according to the invention and subsequently disposed on molded package 7. The mixing of silicone resins with epoxy resins to make hybrid materials permits high dimensional stability and good adhesion of the molding compound to leadframe 6 or the substrate. The free terminal of leadframe 6 is electrically connected to chip 2 by contact 13. The other electric contact is on the bottom of the chip.

Both molded package 7 and optic 82 or 83, respectively, can contain conversion substances or phosphors.

Leadframe 6 can also exhibit an S-shaped flexure, so as to yield a surface-mountable radiation-emitting semiconductor component.

Panel a in FIG. 4 depicts an embodiment having a diffractive optic, and panel b in FIG. 4 depicts an embodiment having a spherical lens.

Figure 5:
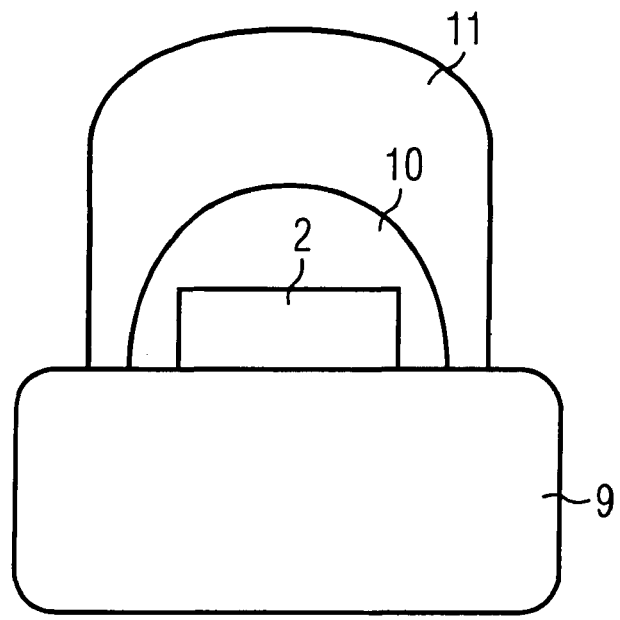
FIG. 5 is a further schematic depiction of a radiation-emitting semiconductor component.

A further embodiment of a radiation-emitting semiconductor component according to the invention is depicted in FIG. 5. This embodiment is a so-called power configuration having a semiconductor chip 2 disposed on a base package 9. Semiconductor chip 2 is provided with an overmolding 10, in front of which an optic 11 is disposed. In a power configuration, overmolding 10 of semiconductor chip 2 is exposed to a high intensity of radiation. It is therefore important to employ a material stable against aging and radiation for overmolding 10. For this reason, overmolding 10 is advantageously made from a molding compound having a high content of silicone resin. Silicone resin satisfies the requirements as to aging and stability against radiation. The lack of dimensional stability on the part of silicone resin is compensated in this embodiment by disposing a dimensionally stable optic 11 in front. Optic 11 therefore encloses overmolding 10 and ensures its dimensional stability. Because optic 11 itself exhibits a content of silicone resins, its stability against aging and radiation is likewise enhanced, and a good bond is produced between optic 11 and overmolding 10.

Because overmolding 10 can be formed from silicone resin and optic 11 from the silicone/epoxy resin hybrid material, the difference in refractive index between the overmolding and the optic is reduced in this embodiment.

Figure 6:
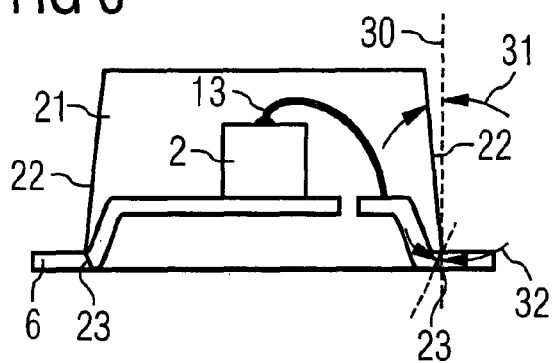
FIG. 6 is a further schematic depiction of a disposition having an optical component.

In the exemplary embodiment according to FIG. 6, an optical component 21 is molded from a preproduct in a transfer molding process by a method according to the invention, in such fashion that it encloses an optoelectronic component 2 disposed on a leadframe 6. Because of the S-shaped flexures of leadframe 6, which are enclosed by optical component 21, leadframe 6 is mechanically anchored to optical component 21. The disposition forms a surface-mountable component.

An internal mold release agent can be admixed with the preproduct before molding into optical component 21 in the transfer molding process, so that removal from the mold after the molding process is facilitated.

The optical component exhibits for example a length of approximately 1.3 mm+/−0.1 mm, a width of approximately 0.8 mm+/−0.1 mm and a height of approximately 0.3 mm+/−0.1 mm. Alternatively, the optical component exhibits for example a length of approximately 1.7 mm+/−0.1 mm, a width of approximately 0.8 mm+/−0.1 mm and a height of approximately 0.65+/−0.05 mm. The optical component can for example also exhibit drafts on lateral faces 22, 23 having angles 31, 32 of 5 to 7 degrees relative to a vertical 30. The drafts can for example facilitate removal from the mold after the transfer molding process. Alternatively, the angles can also be 0 degree.

The optoelectronic component is an LED chip, which is contacted from the side facing away from the substrate by a bond wire 13. It is for example an InGaN-based LED chip exhibiting an emission maximum at 470 nm. By admixing a wavelength conversion substance with the hybrid material or the preproduct, for example on the basis of YAG:Ce, a cold white to warm white light impression can be achieved. In particular, the radiation exiting the optical component of the disposition can exhibit for example a white color impression having CIE 1931 color coordinates x=0.30, y=0.28. Alternatively, the radiation exiting the optical component of the disposition exhibits for example a white color impression having CIE 1931 color coordinates x=0.32, y=0.31.

Alternatively, no wavelength conversion substance is admixed with the hybrid material or the preproduct. Here the radiation exiting the optical component exhibits for example the 470 nm blue radiation emitted by the LED chip. Further, the disposition exhibits for example a radiation angle in the range of from 130 to 170 degrees on the side of the optical component facing away from the substrate.

In the exemplary embodiment according to FIGS. 7a to 7d, in the course of a method according to the invention, an optical component is disposed over a substrate having optoelectronic components.

Figure 7A:
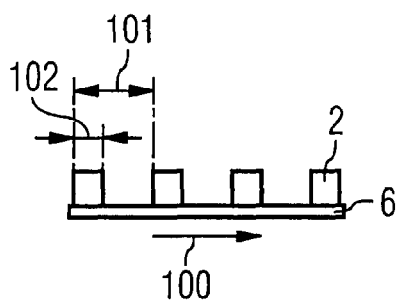
FIGS. 7a to 7e are further schematic depictions of a process for producing a disposition having an optical component.

Thus FIG. 7a depicts a substrate 6 on which a plurality of optoelectronic components 2 are disposed next to one another in row fashion along a direction 100. Substrate 6 is for example a leadframe. Optoelectronic components 2 are LED chips, which are mounted on leadframe 6 at regular intervals with a spacing 101 of 0.6 mm. The light-emitting diodes exhibit for example an edge length 102 of less than approximately 0.4 mm in row direction 100. The number of LED chips disposed on a substrate is dependent on the mold employed and can be for example 26 (not depicted). The leadframe exhibits for example a width of approximately 2.3 mm perpendicular to row direction 100.

Figure 7B:
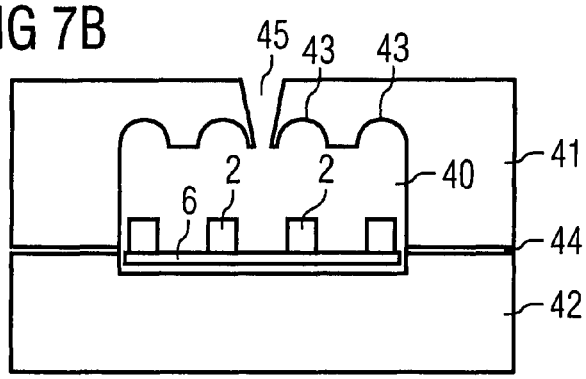

In a further procedural step according to FIG. 7b, leadframe 6 with light-emitting diodes 2 is placed in a cavity 40 of a transfer mold. Here the transfer mold exhibits for example at least two parts 41, 42, which enclose cavity 40. The cavity exhibits the shape of the optical component to be molded, in particular also regions 43 disposed on the side of the cavity facing away from substrate 6 above LED chips 2. Regions 43 are fashioned for example in the shape of a cylinder cut in two lengthwise and exhibit for example a radius of approximately 0.225 mm. A liquefied preproduct is inlet into cavity 40 via a sprue system 45. The preproduct is at least partly cured in cavity 40; the preproduct is advantageously cured to a cured hybrid material, the optical component being formed. The preproduct contains an internal mold-release agent. Removal of the optical component from parts 41, 42 of the transfer mold after curing is facilitated by the internal mold-release agent.

Figure 7C:
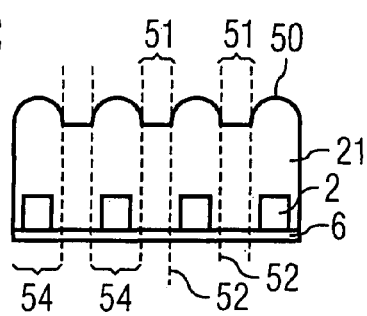

By opening the transfer mold at joining surface 44 between parts 41, 42 of the transfer mold, the disposition of optical component 21 overmolded on leadframe 6 with LED chips 2, according to FIG. 7c, can be removed after the hybrid material or the preproduct has cured. Here the disposition exhibits regions 51 in which there is no LED chip 2 and regions 54 in each of which there is an LED chip. In regions 54 of the disposition on the side facing away from the substrate above LEDs 2, optical component 21 here exhibits regions 50 in the shape of a cylinder cut in two lengthwise. Separation of regions 54 can be carried out in regions 51. As a result of the separation, each region 54 acquires lateral faces 52. For example, separation can be effected by sawing in regions 51 with a saw width of 0.2 mm.

Figure 7D:
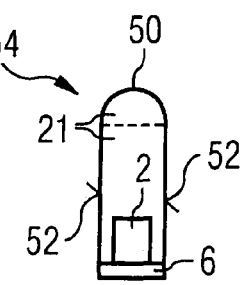
Figure 7E:
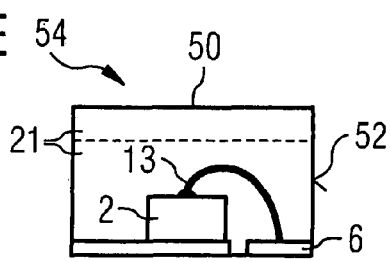

As a result of separation, separated regions 54 yield dispositions according to FIGS. 7d and 7e, which exhibit one LED chip 2 on a leadframe 6 overmolded with an optical component 21. Here FIG. 7d is a front view of the disposition, and FIG. 7e is a lateral view thereof. The disposition exhibits for example a footprint of approximately 0.4 mm by 2.3 mm and a height of approximately 0.5 to 0.7 mm. The optical component exhibits lateral faces 52, which were generated by the separation operation, and a curved region 50 in the shape of a cylinder cut in two lengthwise. Curved region 50 makes possible for example an improved output or focusing of the radiation generated by LED chip 2.

Figure 8:
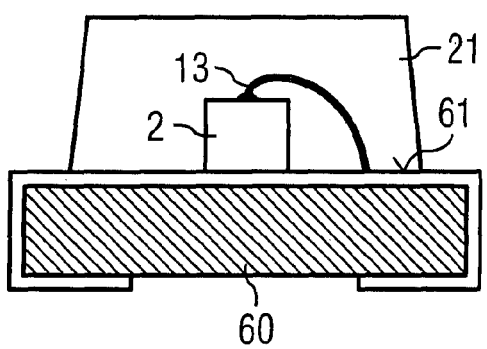
FIG. 8 is a further schematic depiction of a disposition having an optical component.

In the exemplary embodiment according to FIG. 8, an optical component 21 is molded onto a substrate 60 having an LED chip 2. Substrate 2 is a printed circuit board (PCB). The optical component can be molded onto substrate 60 and the LED chip by a transfer molding process employing a foil to facilitate removal from the mold (foil molding). The optical component can be molded onto a printed circuit board having a plurality of LED chips. In order to improve the adhesion of optical component 21 to surface 61 of printed circuit board 60, the surface can be pretreated by flame silicatization before the transfer molding process. After the optical component is molded on, the disposition can be separated into dispositions that exhibit an optical component molded onto a printed circuit board having an LED chip. After separation, the optical component exhibits for example a length of from 1.1 mm to 1.3 mm, a width of from 0.55 mm to 0.65 mm and a height of from 0.3 mm to 0.7 mm.

The LED chip is for example an InGaN-based LED chip exhibiting an emission maximum at 470 nm. By admixing with the hybrid material or the preproduct a wavelength conversion substance, based on YAG:Ce for example, the radiation exiting the optical component of the disposition can exhibit for example a white color impression having CIE 1931 color coordinates x=0.30, y=0.28, having a luminosity of 200 mcd. Here the LED chip can be chosen such that radiation emission takes place parallel to surface 61.

Figure 9:
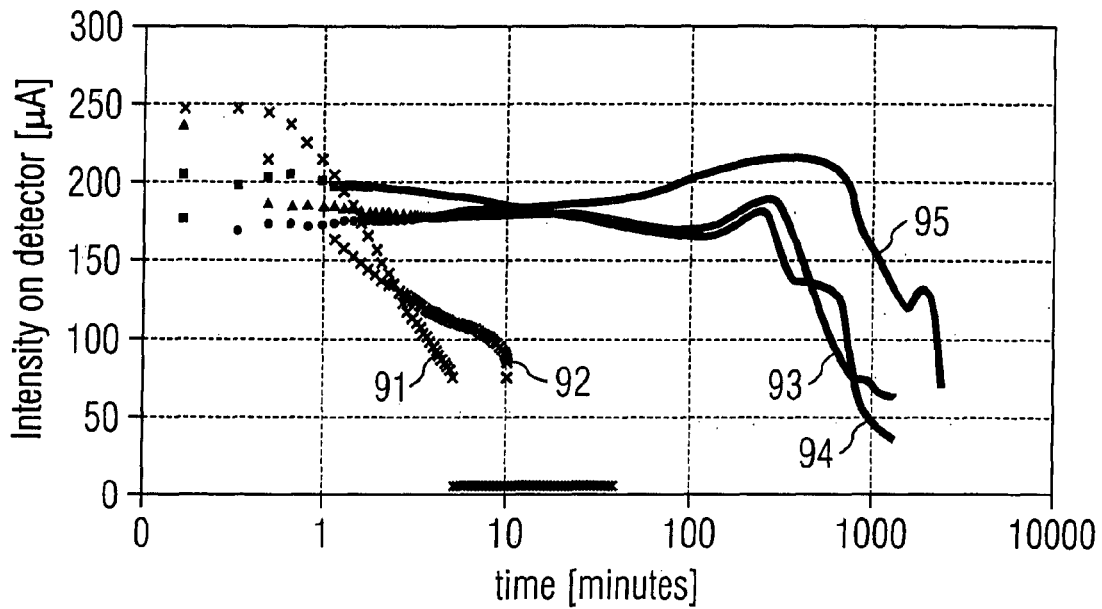
FIG. 9 is a graphical illustration showing the intensity of the detected optical component verses time.

In the exemplary embodiment according to FIG. 9, measurements on the aging stability of some materials for optical components are depicted. For this purpose, a photodetector was used to measure the light intensity of a laser beam having a wavelength of 405 nm, a beam diameter of 20 micrometers and an output power of 25 mW, after transmission through optical components having a thickness of 1 mm. Time in minutes is plotted on the horizontal axis of the graph; on the vertical axis, the measured transmitted light intensity in units of photocurrent. Optical components with commercial epoxy resins were used for measurements 91, 92, while optical components produced from a hybrid material according to the invention were employed for measurements 93, 94, 95. The laser beam action causes steady aging, for example in the form of yellowing of the optical components, which manifests itself in a lower transmitted light intensity. A completely transparent optical component was assumed for a light intensity of 300 microamperes; complete yellowing was assumed for a light intensity of less than 50 microamperes. The optical components according to measurements 93, 94, 95 display an aging stability, with respect to radiation-induced aging, some two orders of magnitude greater than the optical components according to measurements 91, 92.

What is claimed is:

1. A method for producing an optical component, wherein the optical component is produced from a material that comprises a hybrid material, the hybrid material
   exhibiting as first component at least one compound containing siloxane groups and
   exhibiting as second component compounds whose functional groups are selected from imide groups and acrylate groups.

2. The method of claim 1, wherein the component is molded from the hybrid material.

3. The method of claim 1, wherein a hybrid material is employed that exhibits, as first and second components, monomers that are processed to a copolymer.

4. The method of claim 1, wherein a hybrid material is employed that exhibits polymers as first and second components and is processed to a polymer mixture.

5. The method of claim 1, wherein the second component additionally exhibits siloxane groups.

6. The method of claim 1, wherein the hybrid material exhibits a siloxane content of between 10 and 90% by weight.

7. The method of claim 6, wherein the hybrid material exhibits a siloxane content of between 40 and 60% by weight.

8. The method of claim 1, wherein the hybrid material exhibits a viscosity in the range of from 0.5 to 200 Pa s at room temperature.

9. The method of claim 1, wherein the hybrid material is precured to a preproduct, the preproduct being solid at room temperature.

10. The method of claim 9, wherein the preproduct is subjected to size reduction.

11. The method of claim 9, wherein the optical component is formed as a molding from the hybrid material or the preproduct.

12. The method of claim 11, wherein the molding is formed by a method selected from molding, transfer molding and injection molding.

13. The method of claim 12, wherein the preproduct is processed in a transfer molding process.

14. The method of claim 11, wherein the molding is formed in a cavity of a mold.

15. The method of claim 14, wherein a foil is applied to at least part of the surface of the cavity before the molding process.

16. The method of claim 9, wherein the preproduct exhibits a viscosity in the range of from 1 mPa to 30 Pa s at 150° C.

17. The method of claim 9, wherein the hybrid material or the preproduct is processed by curing to a cured hybrid material.

18. The method of claim 17, wherein the cured hybrid material exhibits a hardness of more than 60 Shore D.

19. The method of claim 17, wherein an optoelectronic component on a substrate is at least partly enclosed during the curing of the hybrid material or the preproduct.

20. The method of claim 19, wherein the optoelectronic component on a substrate is disposed in the mold cavity.

21. The method of claim 9, wherein an internal mold-release agent is added to the hybrid material or the preproduct.

22. The method of claim 9, wherein a material is added to the hybrid material or the preproduct in order to raise the refractive index, the material being chemically bonded to the hybrid material as oxide, as particles or as a combination thereof.

23. The method of claim 22, wherein the material for raising the refractive index exhibits titanium, zirconium and/or sulfur chemically bonded to the hybrid material or to the preproduct.

24. The method of claim 22, wherein to the material for raising the refractive index there is added an oxide that is selected from a group, the group comprising $TiO_2$, $ZrO_2$ and $\alpha$-$Al_2O_3$, and/or a non-oxide that comprises gallium nitride.

25. The method of claim 1, wherein the hybrid material exhibits curing times of less than 5 minutes.

26. The method of claim 1 for producing an optical component, wherein the optical component is produced from a material that comprises a hybrid material, the method comprising the following procedural steps:
   A) Converting a preproduct, obtained from the hybrid material by precuring, to a liquid or pasty state, B) Placing the preproduct from procedural step A) in a cavity of a mold, the cavity exhibiting a definite shape, and C) Curing the preproduct to a solid hybrid material, the optical component being made with a shape largely corresponding to the shape of the cavity.

27. The method of claim 26 with the additional procedural steps to be performed before procedural step A):
   A1) Precuring the hybrid material to a preproduct that is solid at room temperature,
   A2) Subjecting the solid preproduct to size reduction to a powder or granulate state, and
   A3) Converting the preproduct after size reduction to a compact shape.

28. The method of claim 1, wherein a wavelength conversion substance is added to the hybrid material or the preproduct, the wavelength conversion substance exhibiting YAG:Ca, TAG:Ce, TbYAG:Ce, GdYAG:Ce, GdTbYAG:Ce, nitrides or silicates or a mixture formed therefrom.

29. The method of claim 1, wherein at least one optoelectronic component on a substrate is encapsulated by the optical component.

30. The method of claim 29, wherein a radiation-emitting semiconductor chip is employed as optoelectronic component.

31. The method of claim 30, wherein a radiation-emitting semiconductor chip capable, when in operation, of emitting radiation is employed, the radiation exhibiting a wavelength in the ultraviolet to green range of wavelengths.

32. The method of claim 29, wherein a substrate is employed that exhibits a leadframe, a printed circuit board, a flex-material-based configuration or a ceramic-based configuration.

33. The method of claim 29, wherein at least portions of the substrate and/or of the optoelectronic component are coated before the molding process with a material that is suitable for enhancing the adhesion to the hybrid material or to the preproduct.

34. The method of claim 1, wherein a multiplicity of optical components are produced and the multiplicity of optical components are subsequently separated.

35. The method of claim 34, wherein separation is effected by cutting, sawing, notching, breaking and/or grinding.

36. An optical component that can be produced by a method of claim 34.

37. The optical component of claim 36, the optical component being a radiation-diffracting optical component, a radiation-refracting optical component, a reflector, a wavelength converter, a package, a portion of a package, an encapsulation, a portion of an encapsulation or a combination thereof.

38. The optical component of claim 37, the radiation-refracting optical component being a spherical lens, an aspherical lens, a cylindrical lens or a Fresnel lens.

39. A disposition comprising an optical component obtainable by a method of claim 1 and an optoelectronic component.

40. The disposition of claim 39, the optical component at least partly enclosing the optoelectronic component.

41. The disposition of claim 39, the disposition being surface-mountable.

42. The method of claim 1 wherein said optical component is formed in a cavity of a molding tool and said optical component is separated from said cavity by a foil.

43. A method for producing an optical component, wherein the optical component is produced from a material that comprises a hybrid material, the hybrid material exhibiting as first component at least one compound containing siloxane groups;

exhibiting as second component compounds whose functional groups are selected from epoxide groups, imide groups and acrylate groups; and wherein the second component additionally exhibits siloxane groups.

44. A method for producing an optical component, wherein the optical component is produced from a material that comprises a hybrid material, the hybrid material exhibiting as first component at least one compound containing siloxane groups;

exhibiting as second component compounds whose functional groups are selected from epoxide groups, imide groups and acrylate groups;

wherein the hybrid material is precured to a preproduct, the preproduct being solid at room temperature; and wherein the preproduct is subjected to size reduction.

45. The method of claim 44, wherein the preproduct after size reduction is shaped.

46. A method for producing an optical component, wherein the optical component is produced from a material that comprises a hybrid material, the hybrid material exhibiting as first component at least one compound containing siloxane groups;

exhibiting as second component compounds whose functional groups are selected from epoxide groups, imide groups and acrylate groups;

wherein the optical component is produced from a material that comprises a hybrid material, the method comprising the following procedural steps:

A) converting a preproduct, obtained from the hybrid material by precuring, to a liquid or pasty state, B) placing the preproduct from procedural step A) in a cavity of a mold, the cavity exhibiting a definite shape, and C) curing the preproduct to a solid hybrid material, the optical component being made with a shape largely corresponding to the shape of the cavity;

with the additional procedural steps to be performed before procedural step A):

A1) precuring the hybrid material to a preproduct that is solid at room temperature, A2) subjecting the solid preproduct to size reduction to a powder or granulate state, and A3) converting the preproduct after size reduction to a compact shape.

47. A method for producing an optical component, wherein the optical component is produced from a material that comprises a hybrid material, the hybrid material exhibiting as first component at least one compound containing siloxane groups;

exhibiting as second component compounds whose functional groups are selected from epoxide groups, imide groups and acrylate groups;

wherein the optical component is formed as a molding from the hybrid material or a preproduct, which is produced by precuring the hybrid material, the preproduct being solid at room temperature;

wherein the molding is formed in a cavity of a mold; and wherein a foil is applied to at least part of the surface of the cavity before the molding process.

48. The method of claim 47, wherein the foil prevents wetting of the surface of the cavity by the hybrid material or the preproduct.

49. A method for producing an optical component, wherein the optical component is produced from a material that comprises a hybrid material, the hybrid material
- exhibiting as first component at least one compound containing siloxane groups;
- exhibiting as second component compounds whose functional groups are selected from epoxide groups, imide groups and acrylate groups;
- wherein a material is added to the hybrid material or a preproduct, which is produced by precuring the hybrid material the preproduct being solid at room temperature, in order to raise the refractive index, the material being chemically bonded to the hybrid material as oxide, as particles or as a combination thereof; and
- wherein the material for raising the refractive index exhibits titanium, zirconium and/or sulfur chemically bonded to the hybrid material or to the preproduct.

50. A method for producing an optical component, wherein the optical component is produced from a material that comprises a hybrid material, the hybrid material
- exhibiting as first component at least one compound containing siloxane groups;
- exhibiting as second component compounds whose functional groups are selected from epoxide groups, imide groups and acrylate groups;
- wherein a material is added to the hybrid material or the preproduct in order to raise the refractive index, the material being chemically bonded to the hybrid material as oxide, as particles or as a combination thereof; and
- wherein to the material for raising the refractive index there is added an oxide that is selected from a group, the group comprising $TiO_2$, $ZrO_2$ and $\alpha\text{-}Al_2O_3$, and/or a non-oxide that comprises gallium nitride.

51. The method of claim 50, wherein glass particles are admixed with the material for raising the refractive index.

52. A method for producing an optical component, wherein the optical component is produced from a material that comprises a hybrid material, the hybrid material
- exhibiting as first component at least one compound containing siloxane groups;
- exhibiting as second component compounds whose functional groups are selected from epoxide groups, imide groups and acrylate groups;
- wherein at least one optoelectronic component on a substrate is encapsulated by the optical component; and
- wherein at least portions of the substrate and/or of the optoelectronic component are coated before the molding process with a material that is suitable for enhancing the adhesion to the hybrid material or to the preproduct.

53. The method of claim 52, wherein the material is a silicate.

54. The method of claim 53, wherein coating is effected by flame silicatization.

55. A method for producing an optical component, wherein the optical component is produced from a material that comprises a hybrid material, the hybrid material
- exhibiting as first component at least one compound containing siloxane groups;
- exhibiting as second component compounds whose functional groups are selected from epoxide groups, imide groups and acrylate groups;
- wherein said optical component is formed in a cavity of a molding tool and said optical component is separated from said cavity by a foil.

* * * * *

UNITED STATES PATENT AND TRADEMARK OFFICE
CERTIFICATE OF CORRECTION

PATENT NO. : 8,247,263 B2
APPLICATION NO. : 11/885374
DATED : August 21, 2012
INVENTOR(S) : Bert Braune et al.

Page 1 of 1

It is certified that error appears in the above-identified patent and that said Letters Patent is hereby corrected as shown below:

Col. 20, line 33, in Claim 16 change "1 mPa" to "1 mPa s".

Signed and Sealed this
Fifth Day of February, 2013

Teresa Stanek Rea
*Acting Director of the United States Patent and Trademark Office*